United States Patent [19]

Bauer

[11] 4,408,346
[45] Oct. 4, 1983

[54] KEY ASSEMBLY

[75] Inventor: Karl-Heinz Bauer, Bad Neustadt, Fed. Rep. of Germany

[73] Assignee: Preh Elektrofeinmechanische Werke Jakob Preh, Bad Neustadt, Fed. Rep. of Germany

[21] Appl. No.: 301,660

[22] Filed: Sep. 14, 1981

[30] Foreign Application Priority Data

Oct. 18, 1980 [DE] Fed. Rep. of Germany ....... 3039402

[51] Int. Cl.³ .............................................. H04B 1/08
[52] U.S. Cl. .................................... 455/175; 160/201; 312/7.1; 312/297; 334/85; 358/254; 455/176; 455/347
[58] Field of Search ................. 455/90, 128, 170, 175, 455/176, 347; 358/254; 312/7.1, 7.2, 297; 361/344, 390, 422; 49/157; 334/85; 160/201, 231

[56] References Cited

U.S. PATENT DOCUMENTS 3,110,533  11/1963  Le Bron .......................... 312/297
3,522,542  8/1970  Labude et al. ...................... 455/175
4,217,012  8/1980  Klaus ............................ 312/297

FOREIGN PATENT DOCUMENTS 1591713  9/1972  Fed. Rep. of Germany .
1911898  8/1978  Fed. Rep. of Germany .
889447   2/1962  United Kingdom ............ 358/254

OTHER PUBLICATIONS

German—DE periodical "Funkschau", 1968, No. 10, p. 306.

Primary Examiner—Marc E. Bookbinder
Attorney, Agent, or Firm—Woodcock, Washburn, Kurtz, Mackiewicz & Norris

[57] ABSTRACT

A key assembly for receiving devices employed in communication engineering, particularly for broadcasting and television receivers, comprises a casing provided with mutually releasable keys in the form of press buttons adapted to switch on storable, selectively adjustable electrical values supplied by channel memories including a plurality of voltage dividers for capacitance diode tuning and including, in association with the individual press buttons, rotatable and slidable knobs for channel tuning and, if desired, for selecting a given frequency range, said frequency range being adjustable by rotating the depressible and rotatable knob into any of a plurality of detented angular positions, with said depressible and rotatable knob being in a position, preferably a depressed position, different from the tuning position. Said depressible and rotatable knobs (5) are disposed in a recess (6) of said casing (3, 18) and are covered by a cover member (7; 8; 9; 34) which is slidably guided in a longitudinal direction in said casing.

5 Claims, 7 Drawing Figures

KEY ASSEMBLY

BACKGROUND OF THE INVENTION

The present invention sets out from a key assembly as described in the generic part of claim 1.

BRIEF DESCRIPTION OF THE PRIOR ART

Key assemblies of the type just named are employed in various forms preferably for tuning and switching-on high-frequency receivers such as radio or television receivers. By pressing a single key it is possible to select a preset tuning voltage and thus to select the broadcasting station or transmitter associated therewith or the respective channel. Storage of the tuning voltage adjusted is effected in channel memories comprising spindle-type resistors connected to act as voltage dividers. The channel memories and their indicating means as well as perhaps the adjusting means provided for frequency range preselection need not and should not be directly accessible during normal operation of the unit so as to prevent incidental or inadvertent maloperation. Besides, too large a number of knobs or buttons capable of being both pressed and rotated may detract from the pleasing appearance of the unit.

In order to avoid this disadvantage, it has been known (DE periodical "Funkschau", 1968, No. 10, p. 306) to construct the key assembly in the form of a plug-in unit with the switch operating keys being arranged on the face of the unit so as to be accessible with the unit in its plugged-in condition, whereas the tuning controls for the voltage dividers and for the range selector means are only accessible after the unit has been pulled out of its receptacle. However, the necessity of providing guide means for the plug-in unit and of employing flexible leads tends to increase manufacturing costs and to detract from its dependability in operation.

Moreover, there has been disclosed in DE-AS No. 1 591 713 a key assembly in which each channel memory is accommodated in a pocket or a shallow recess and in which there is provided for each channel memory a cover having the shape of a large key. This cover, which is spring-biased towards its rest position, is arranged to be both rotated and pivoted, and it bears on the switching-on member in such a manner that it is possible to operate said member by exerting pressure on the closed cover. Since said switching-on member, besides providing a switching action, also serves to perform a tuning operation, relatively large spaces have to be provided between adjacent switching-on members so as still to enable the switching-on members providing a tuning operation to be easily operated by means of a finger even in their depressed position.

Furthermore there has been disclosed in DE-AS No. 1 911 898 a key assembly which, while comprising the same number of depressible and rotatable keys, is of smaller overall width, said depressible and rotatable keys serving to switch on the desired channels being operable by means of individual keys which are pivotally mounted in a foldable door or flap which is commonly associated with all depressible and rotatable keys. Frequency range selection is only possible with the door or flap in its open position. In the frame of the flap made of a plastic material there is provided, at one of its longitudinal edges, a metallic rail whose ends are provided with pivot pins each adapted to cooperate with a metallic retainer, said retainers, in turn, being mounted in the casing of the key assembly. These additional structural provisions are intended to prevent the flap from being detached from its hinges.

OBJECT OF THE INVENTION

It is an object of this invention to provide a key assembly of the general type mentioned earlier in which a device which is easy to manufacture serves to protect said depressible and rotatable keys against incidental or inadvertent operation, the structure being such as at the same time to reduce manufacturing costs and to improve the appearance of the key assembly.

SUMMARY OF THE INVENTION

According to the invention, this object is attained by the features indicated in the characterizing part of patent claim 1. Further advantageous embodiments of the invention can be seen from the sub-claims.

Since the cover member is in the form of a sliding flexible ribbon resembling a Venetian blind, the use of fragile hinges required for a folding door or flap may be dispensed with. Nor is it necessary to provide a detent device adapted to prevent the flap from opening incidentally. Since it is not possible to pivot folding doors through 180 degrees, the flap door in its open position may interfere with the fingers of the operator. Since, according to the invention, use is made of a ribbon which is slidably supported in the casing, there are no projecting parts which might interfere with operation of the controls. Furthermore, it is possible to provide a recess of greater length and smaller width so as to ensure an improved electrical and mechanical protection. This, in turn, is in agreement with the desirability of employing key assemblies occupying as little space as possible and capable of being mounted on the front of the respective units, such assemblies being of compact design without sacrificing the ease with which they may be operated. In addition, a slidable ribbon compares favorably with a folding door as regards the protection against dust and moisture since groove-and-tongue guiding means are provided. Another advantage of a slidable ribbon is to be seen in the fact that, with the ribbon in an intermediate position, additional devices such as an earphone jack provided near one end of the sliding range are easily accessible, there being no projecting parts which may be damaged. In a case in which a folding door is employed it would be necessary either to open the entire door or to provide the door with a separate closable window providing access with the door in its closed position.

BRIEF DESCRIPTION OF THE DRAWINGS

The invention and further particulars will be described more specifically hereinafter with reference to preferred embodiments shown in the drawings, in which.

DETAILED DESCRIPTION OF THE PREFERRED EMBODIMENTS OF THE INVENTION

Figure 1:
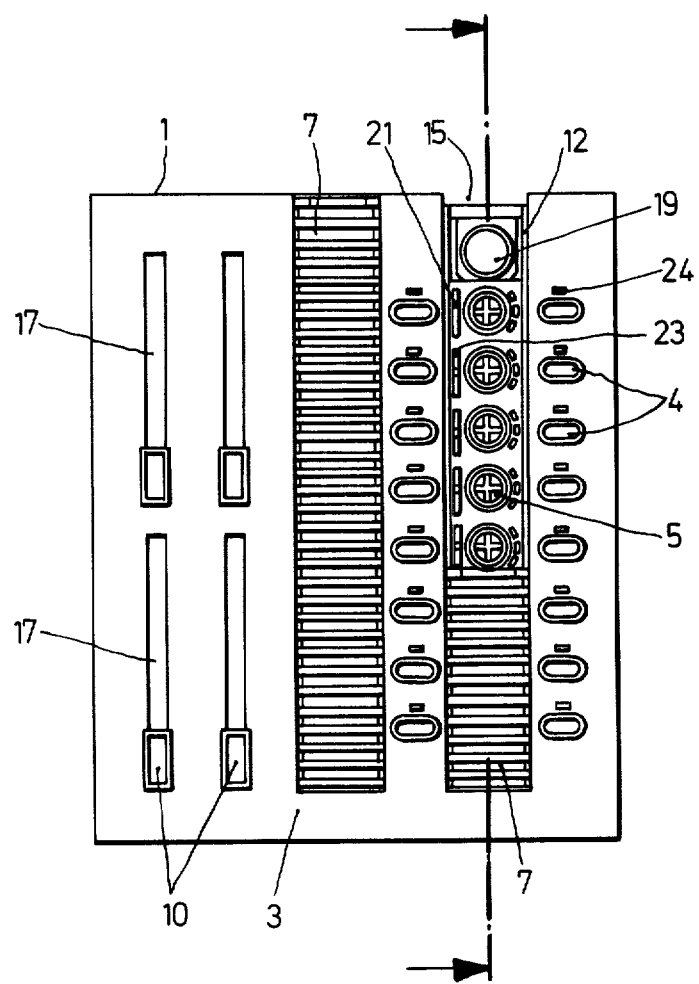
FIG. 1 is a front view of an embodiment of a key assembly according to the invention.
Figure 2:
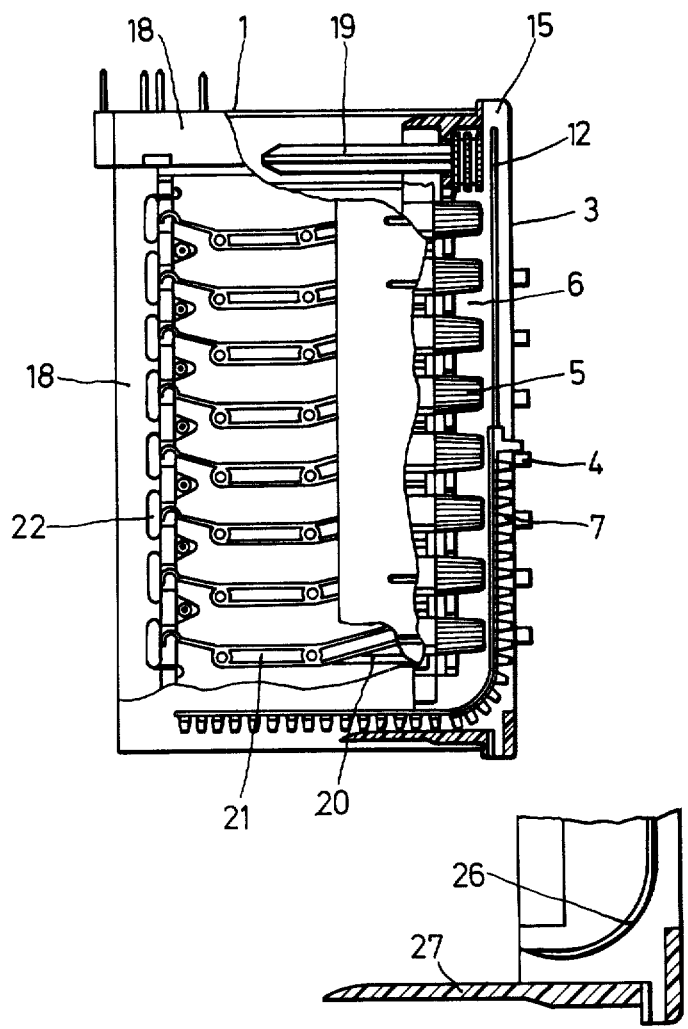
FIG. 2 is a partially sectioned side elevation of the key assembly of FIG. 1.

The key assembly shown in FIG. 1 and generally designated by reference numeral 1 comprises two rows of eight keys 4 adapted to switch on the tuning voltages preset in the individual channel memories, said keys being capable of being released in relation to one another by means of a locking rail. It will be understood that it would, of course, be possible to provide a smaller or larger number of keys. The key assembly proper comprises a casing including a memory housing 18 shown in FIG. 2 provided with a front panel 3 with the adjusting, switching and indicating means being integrated into a structural unit.

In the embodiment shown in FIG. 1 the various controls serving to adjust volume, picture brightness, contrast, etc. are in the form of a plurality of slide resistors 17 disposed alongside the rows of keys 4. It is also possible to employ rotary potentiometers in the place of said sliding resistors. It is a matter of course that it is possible, regardless of whether sliding or rotary resistors are employed, to arrange the adjusting members above or below the rows of keys.

The sliding resistors employed in the present case are constituted in a known manner by a resistance element and a collector track. These two elements are bridged electrically by a metallic sliding contact spring which is attached to a spring carrier. Said spring carrier may be slidably guided in a resistor housing which is, in turn, secured to the front panel of the casing. This arrangement affords the advantage that it is also possible to employ a separate resistor housing forming a structural unit. Said spring carrier is provided with a projection which extends through a slot provided in front panel 3, the free end of each projection being formed with flexible tongues onto which an operating button 10 is snapped.

If necessary an additional mains switch may be mounted in the front panel of the casing. This mains switch is conveniently also provided with a housing of its own so that it may be installed as a separate structural unit.

As shown in FIG. 2, the memory housing 18 proper is disposed behind the keys 4. This housing contains the rotary resistors forming the channel memories. Each rotary resistor comprises a spindle along which a spring carrier is guided, the spring carrier having attached thereto a sliding spring adapted to establish an electrical connection between the resistor and the spindle. The desired tuning voltage is adjusted by suitably positioning the spring carrier. The individual resistors are disposed side by side on a plate made of insulating material, said plate being retained in the memory housing. One end of each spindle is provided with a depressible and rotatable button 5 which extends into the recess 6 of front panel 3 and which has a circumferential surface which is knurled or serrated or otherwise shaped to permit manual operation without any additional tool. In addition each depressible and rotatable button 5 is provided with an axial recess having a predetermined internal profile. When tuning is to be effected, a socket wrench 19 is inserted into this recess, said socket wrench being profiled to match said recess so as to permit the respective spindle to be driven in rotation. Said socket wrench is also adapted to operate the switching means serving to select the desired frequency range. In this case, it is only necessary to press the button and then to turn it into one of its switching positions.

The spring carrier of each spindle resistor is integrally formed with a pin section which, according to FIG. 2, extends through an elongated recess 20 provided in memory housing 18 and through an elongated hole (not shown) of an indicating member. This elongated hole extends the length of the entire tuning range. Each indicating member is formed by a deflectable indicating tongue 21 provided with said elongated hole within the range of adjustment, said indicating tongues being integrally formed at one end thereof with a mounting rail 22. This mounting rail is provided in common for all indicating tongues and is retained in memory housing 18 by spring action. The other end extends at an angle, this angular section being visible in a window 23 provided in recess 6 of the casing front panel. Each elongated hole is provided with a slight curvature so that the indicating tongues are deflected depending on the position of the spring carrier. This arrangement facilitates indication of the position of the spring carrier and thus indication of the tuning voltage adjusted.

In order to improve the visibility of the keys from a distance, it is possible to provide the key assembly with an additional luminous indicating device which may include, for example, a plurality of light guides forming a star-like arrangement surrounding a source of light, said light guides extending to the individual keys associated therewith, and the ends of the light guides being visible behind windows 24 with which the front panel of the casing is provided as shown in FIG. 1. The source of light includes a socket made of a transparent plastic material having a cavity in which a light bulb is housed. The ends of the light guides extending to the keys are provided with light beam interrupting means, the arrangement being such that, with the key in its undepressed position, the light beam is interrupted so that the end positioned behind the respective window will remain dark.

Figure 3:
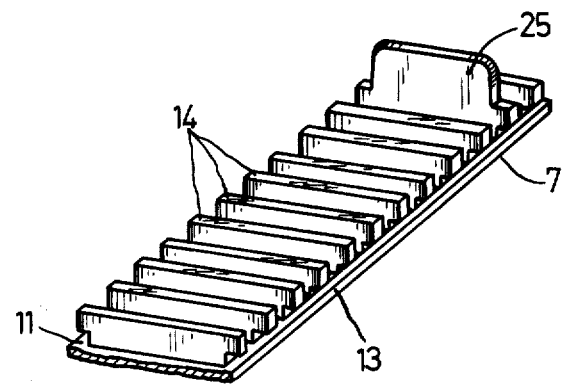
FIG. 3 is a perspective view of a cover member in the form of a flexible ribbon.

In order to prevent immediate access to the adjusting and indicating means during normal operation of the unit, such means are housed in recess 6 of front panel 3. This recess is concealed by a cover member which is slidably guided in a longitudinal direction in the front panel. This is intended to avoid incidental or inadvertent maloperation of the unit. FIGS. 3 to 7 show a number of possible embodiments of said cover member. This cover member may also be constructed as a rigid sliding member. According to FIGS. 3 to 7, however, the cover member is constructed as a flexible ribbon supported by the front panel of the casing and arranged to be deflected in the manner shown in FIG. 2 as it is being slidably moved. To permit operation of the cover member, it is provided with actuating means 25 as shown in FIG. 3. The front panel is provided with an aperture 15 (FIG. 2) permitting the cover member to be inserted. The ribbon is guided in the front panel by groove and tongue means. These means include guide rails 12 extending on both sides along the recess.

In the first embodiment shown in FIG. 3 the flexible ribbon 7 comprises an elongated base member 13 having integrally formed therewith a plurality of ribs 14 extending at right angles to the sliding direction of the ribbon. The height of ribs 14 is such that their outwardly directed surfaces are in alignment with the outer surface of the front panel. This affords a pleasing appearance of the unit. At their ends, ribs 14 are provided with recesses 11 adapted to receive the associated tongues 12 of the front panel so that the ribbon is practically provided with groove and tongue guiding means.

As shown in detail in the lower part of FIG. 2, each tongue 12 comprises a curved section 26 which extends away from the front panel at the end which is remote from aperture 15. In addition, the bottom of the casing front panel is provided with an integrally formed wall portion 27. As ribbon 7 is slid in a downward direction, it is deflected by curved portion 26 and thereafter guided between wall section 27 and the memory housing. Thus, curved portion 26 constitutes a ribbon deflecting means. In order to facilitate insertion of the ribbon into the guide means, the entry portion of the curved section is slightly rounded and pointed.

Figure 4:
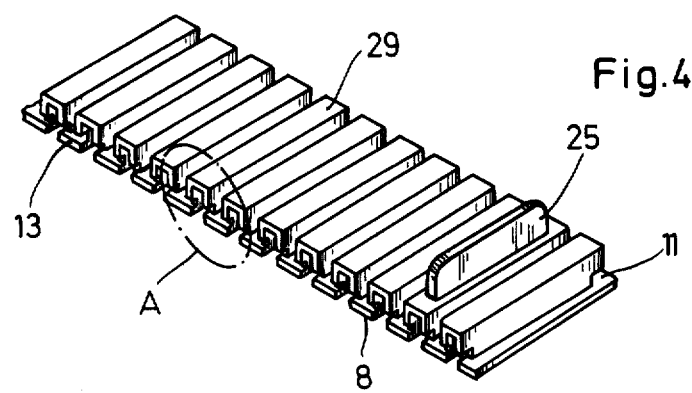
FIG. 4 is a perspective view of another embodiment in the form of a flexible ribbon.
Figure 5:
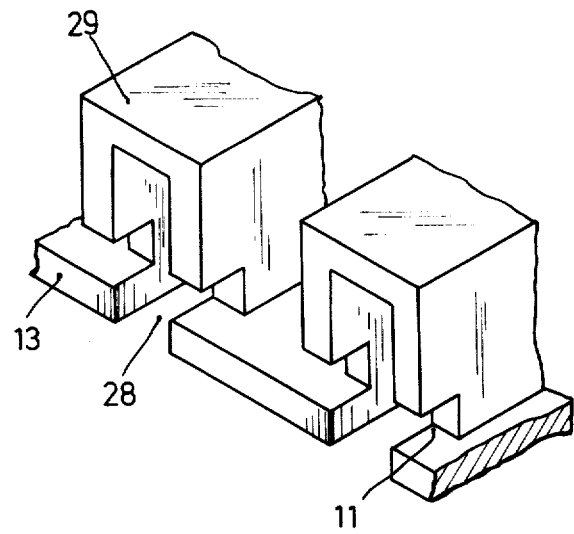
FIG. 5 is an enlarged showing of detail A indicated in FIG. 4.

FIGS. 4 and 5 show another embodiment in the form of a flexible ribbon 8 which differs from ribbon 7 of FIG. 3 in that its base member is interrupted by transverse slots 28. As particularly shown in FIG. 5, the individual parts of the base member are interconnected by U-shaped hollow ribs 29.

Figure 6:
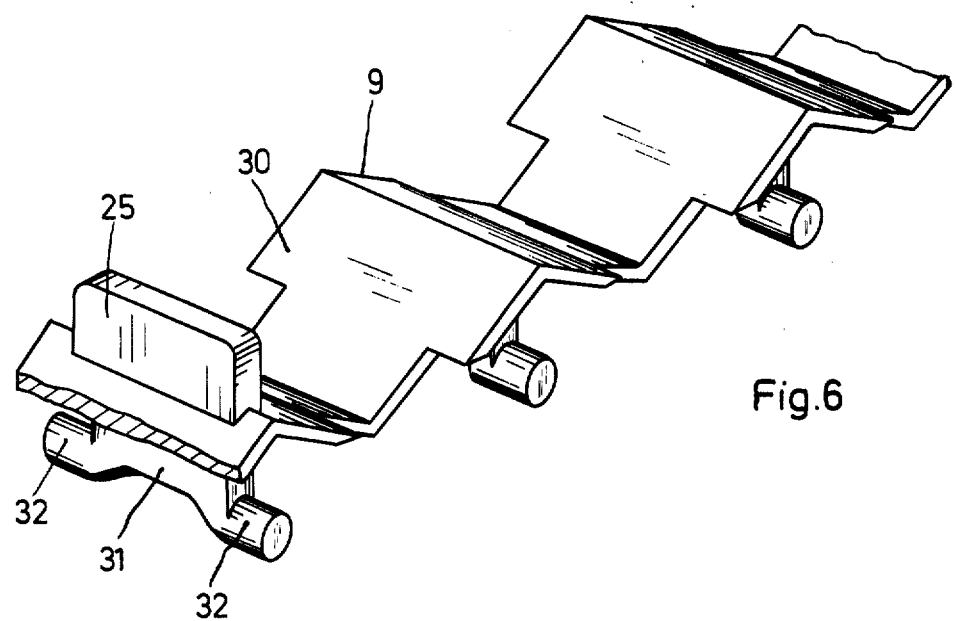
FIG. 6 is a perspective view of another embodiment of a flexible ribbon.
Figure 7:
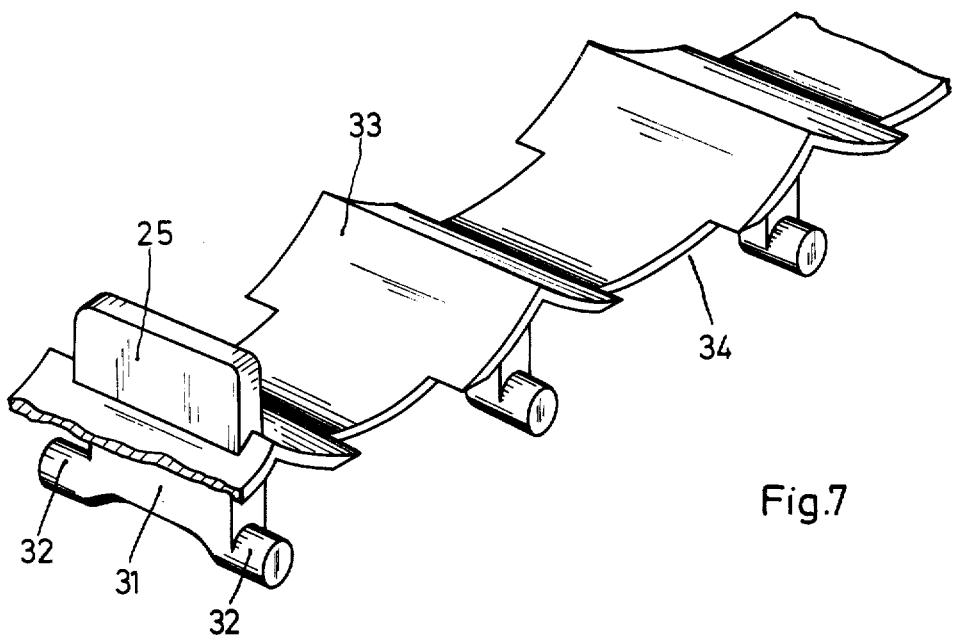
FIG. 7 is a perspective view of still another embodiment of a flexible ribbon.

FIGS. 6 and 7 show two further embodiments. In the embodiment shown in FIG. 6, the ribbon 9 comprises a plurality of interconnected links. Each link comprises an upper portion 30 resembling a ridge roof and a lower portion 31. Pin sections 32 are integrally formed with the ends of lower portion 31. The ribbon is disposed in the front panel in such a way that the guide rails extend between the pin section on the one hand and the projecting portions of the upper parts of the links on the other.

FIG. 7 shows another embodiment of the upper sections of ribbon links. In this case, the upper sections 33 are integrally interconnected and have such a shape that they constitute a festoon-like structure. Otherwise ribbon 34 functions in the same manner as ribbon 9 shown in FIG. 6.

What is claimed is:

1. Channel selecting and voltage divider presetting apparatus for high frequency receivers of the type used particularly for broadcasting and television sets, comprising
 a housing provided with mutually releasable push buttons for switching on storable, selectively adjustable electrical values of channel memories,
 a plurality of rotary and depressible press buttons associated with respective ones of said push buttons for channel tuning and optionally for selecting a frequency range which is adjustable, said housing having a recess and said press buttons being positioned within said recess,
 a flexible ribbon slidable in and normally covering said recess, which ribbon is provided with an operating member integrally formed therewith, said recess having tongue guide means extending on opposite sides thereof and said ribbon having associated grooves on opposite sides thereof, said tongue guide means being engaged in said grooves so as to guide said ribbon in moving through said recess, and
 an aperture at one end of said recess permitting said ribbon to be introduced, and deflecting means at the other end of said recess for deflecting said ribbon relative to said recess.

2. The apparatus according to claim 1, characterized in that said ribbon has an outer surface which is at least partially in alignment with the outer surface of said housing adjacent to said recess.

3. The apparatus according to claim 1, characterized in that said ribbon comprises a continuous base member having integrally formed therewith a plurality of ribs disposed in spaced parallel relation and extending at right angles to the direction of sliding motion of said ribbon.

4. The apparatus according to claim 1, characterized in that said ribbon comprises a plurality of base members separated by slots, said base members being interconnected by U-shaped hollow ribs integrally formed with said base members extending parallel in spaced relationship and at right angles to the direction of sliding motion of said ribbon.

5. The apparatus according to claim 1, characterized in that said ribbon is comprised of a plurality of interconnected links with each link comprising an upper portion resembling a ridge roof and a lower portion provided with a peg at least one end thereof, said tongue of said housing being disposed between said upper portions on the one hand and said pegs of said lower portions on the other so that said ribbon is guided for sliding motion in relation to said housing.

* * * * *